(12) United States Patent
Frisch et al.

(10) Patent No.: US 6,930,879 B2
(45) Date of Patent: Aug. 16, 2005

(54) ELECTRONIC MODULE

(75) Inventors: Michael Frisch, Munich (DE); Ralf Ehler, Budapest (HU)

(73) Assignee: Tyco Electronics AMP GmbH, Bensheim (DE)

( * ) Notice: Subject to any disclaimer, the term of this patent is extended or adjusted under 35 U.S.C. 154(b) by 0 days.

(21) Appl. No.: 10/435,962

(22) Filed: May 12, 2003

(65) Prior Publication Data

US 2004/0004820 A1 Jan. 8, 2004

(30) Foreign Application Priority Data

May 15, 2002 (EP) .............................. 02010787

(51) Int. Cl.⁷ ................................................ H05K 5/00
(52) U.S. Cl. ........................ 361/679; 361/737; 257/674
(58) Field of Search ................................ 361/679–687, 361/737, 820, 760, 783, 772–774; 439/68; 257/666, 669, 674, 676–677

(56) References Cited

U.S. PATENT DOCUMENTS

| | | | |
|---|---|---|---|
| 4,607,276 A | 8/1986 | Butt ............................ 357/70 |
| 6,259,022 B1 * | 7/2001 | Steffen ....................... 174/52.2 |
| 6,265,765 B1 | 7/2001 | DiStefano et al. .......... 257/678 |
| 6,338,983 B1 * | 1/2002 | Steijer et al. ............... 438/123 |
| 6,378,758 B1 | 4/2002 | Haba ....................... 228/180.1 |
| 2002/0027283 A1 * | 3/2002 | Hiyoshi ..................... 257/703 |

FOREIGN PATENT DOCUMENTS

| | | |
|---|---|---|
| EP | 1 198 001 A2 | 4/2002 |
| EP | 1 209 742 A1 | 5/2002 |

OTHER PUBLICATIONS

European Search Report; Application No. EP 03 01 003; dated Apr. 5, 2004.

* cited by examiner

*Primary Examiner*—Hung Van Duong
(74) *Attorney, Agent, or Firm*—Barley Snyder LLC

(57) ABSTRACT

An electronic module has a semiconductor arranged on a substrate. The semiconductor has an electrically conductive contact face on a side remote from the substrate. A contacting unit is configured to be at least partially elastically yielding. A support element is configured to press the contacting unit toward the substrate to make electrical contact. The contacting unit contacts the substrate and/or the contact face.

11 Claims, 2 Drawing Sheets

ELECTRONIC MODULE

BACKGROUND OF THE INVENTION

The invention relates to an electronic module with a semiconductor.

DESCRIPTION OF THE PRIOR ART

To achieve continuous disturbance-free operation of a semiconductor, there must be reliable electrical contact and adequate heat dissipation. Reliable electrical contact is important, because a specific current flux dependent upon corresponding electrical contact of a semiconductor is required to operate a semiconductor in an electronic module. To further maintain operability, there must be adequate heat dissipation of heating that occurs during operation of the semiconductor due to heat loss.

In power semiconductors, for example, where current can assume very high operation values, heat loss can be very high and it is often difficult to achieve reliable electrical contacting and adequate heat dissipation. Many methods for electrically contacting semiconductor chips are already known. For example, in "wire bonding" a lower side of the chip is fastened to a substrate and an upper side of the chip is electrically contacted by welded-on wires. In "tape automated bonding" (TAB), the chip is connected at a plurality of points to a printed conductor structure via contact bumps with simultaneous pressure and heat. In the "flip-chip method", the chip is connected to the substrate with pressure and heat via contact bumps with an active side facing the substrate. Also known are various adhesion methods and other contacting methods, some of which have been developed for special applications.

Despite the large number of known methods of contacting, there is still a need to improve the contacting of semiconductors of an electronic module, in particular power semiconductors, to ensure disruption-free operation of the electronic module over as long a period as possible. Moreover, the production costs in known contacting methods are sometimes very high and make economical manufacture difficult. It is therefore desirable to develop an electronic module with a semiconductor that has reliable electrical contacting and low manufacturing costs.

SUMMARY OF THE INVENTION

The invention relates to an electronic module that has a semiconductor arranged on a substrate. The semiconductor has an electrically conductive contact face on a side remote from the substrate. A contacting unit is configured to be at least partially elastically yielding. A support element is configured to press the contacting unit toward the substrate to make electrical contact. The contacting unit contacts the substrate and/or the contact face.

DETAILED DESCRIPTION OF THE PREFERRED EMBODIMENT

Figure 1:
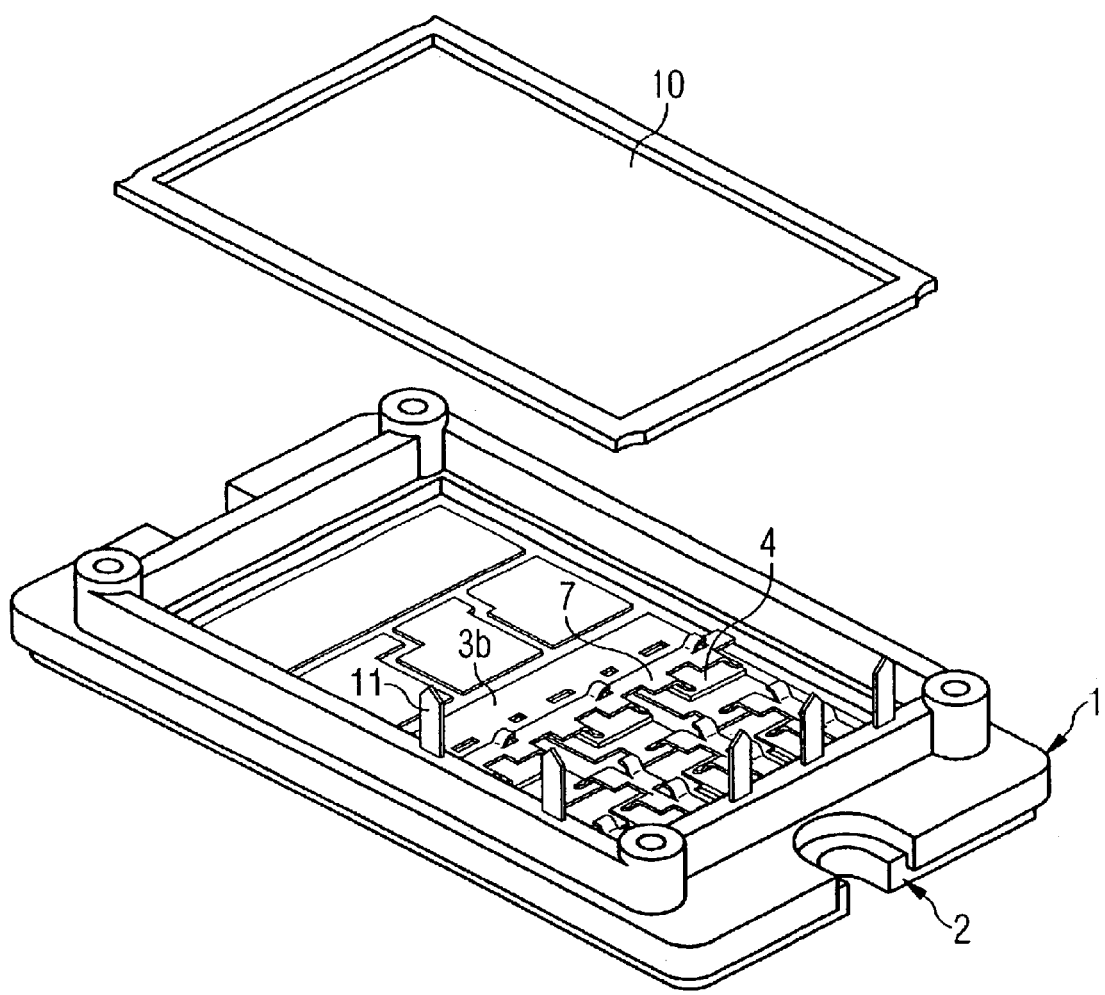
FIG. 1 is a perspective view of an embodiment of an electronic module according to the invention.
Figure 2:
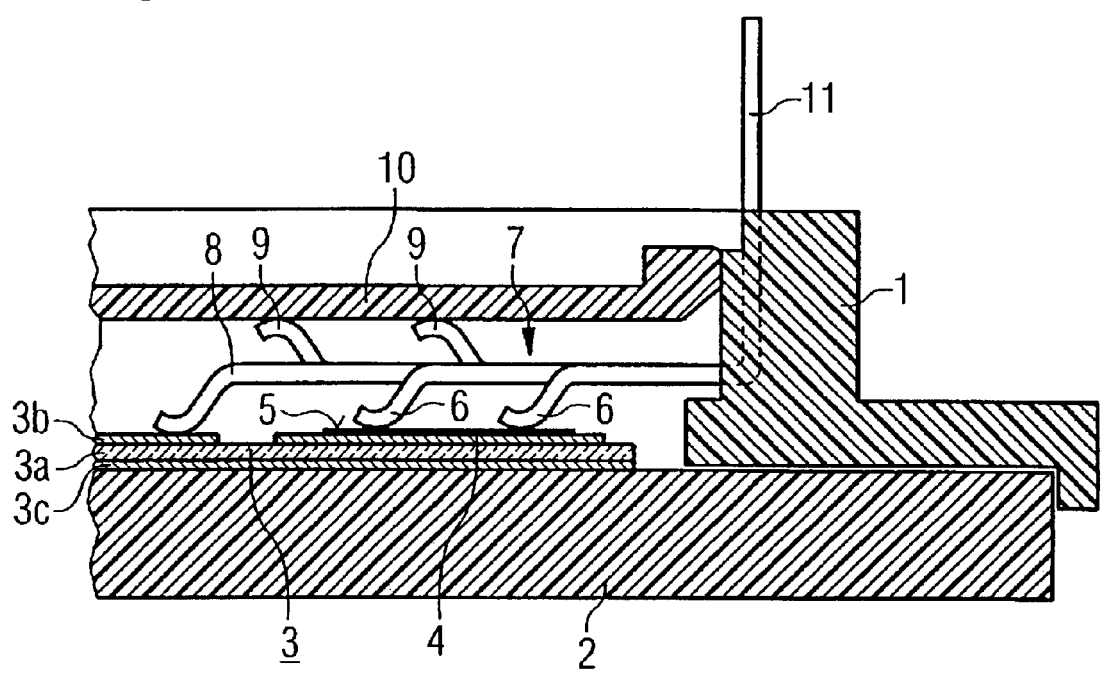
FIG. 2 is a vertical sectional view taken along a longitudinal side of the electronic module of FIG. 1.

FIGS. 1 and 2 show an electronic module, such as a power module having a three-phase bridge rectifier constructed by a vertical method. The electronic module has a housing 1. The housing 1 is provided to protect sensitive electronics contained therein from external influences, such as mechanical effects or soiling. A substrate 3 is arranged on a base plate 2 of the housing 1. The substrate 3 may be a copper-coated ceramic having a copper layer 3b, 3c applied to either side of a ceramic carrier 3a. The copper layers 3b, 3c are formed to correspond to the desired wiring of the electronic module to form printed conductors. The copper layers 3b, 3c are also optionally through-hole plated.

As best shown in FIG. 2, a plurality of semiconductors 4 is arranged on the substrate 3. Lower sides of the semiconductors 4 (the sides facing the substrate 3) are respectively connected to the substrate 3, for example, by adhesive or soldering, such that there is optimal electrical and thermal contact between the substrate 3 and the semiconductors 4. Upper sides of the semiconductors 4 (the sides remote from the substrate 3) may be formed as contact faces 5.

Contacting units 7 have a plurality of contact tongues 6 extending therefrom. The contacting tongues 6 rest on the contact faces 5 to electrically connect the semiconductor 4 to the corresponding contacting unit 7. The contacting units 7 are each configured as a sheet-metal part with a flat central piece 8. The sheet-metal part may, for example, be a copper/beryllium alloy. The contacting unit 7 may be formed as a stamping, a cut part or as an etched part. The contact tongues 6 are configured in one piece with the central piece 8. The contact tongues 6 are formed as narrow strips which are partially stamped free from the central piece 8 and project obliquely from a main plane of the central piece 8. Ends of the contact tongues 6 are bent in such a way that the ends are oriented approximately parallel to the main plane of the central piece 8. In the embodiment shown, each contacting unit 7 has two mutually parallel rows of the contact tongues 6. Between the two mutually parallel rows of the contact tongues 6, support elements 9 project obliquely from the main plane of the central piece 8 on a side opposite from the contact tongues 6 of the central piece 8. The support elements 9 are formed by free stamping and have a similar form as the contact tongues 6.

The contact tongues 6 and the support elements 9 are configured such that the contact tongues 6 and the support elements 9 elastically flex inward toward the main plane of the central piece 8 when the housing 1 of the electronic module is sealed by a cover 10 that supports the support elements 9. Once flexed inward, the contact tongues 6 and the support elements 9 try to resile to their original position causing the contact tongues 6 to be pressed against the contact faces 5 of the semiconductors 4 or against the copper layer 3b of the substrate 3. The contacting units 7 are pressed with the contact tongues 6 against the contact faces 5 of the semiconductors 4 or against the copper layer 3b of the substrate 3 and, therefore, are simultaneously fixed with respect to their lateral position. To facilitate positioning of the contacting units 7 in the electronic module, recesses (not shown) may be formed at an edge of the housing 1 for receiving the contacting units 7. The recesses (not shown), in co-operation with the cover 10, fixedly position the contacting units 7 to eliminate subsequent slipping of the contacting units 7 after fitting of the cover 10.

External connections of the electronic module may be produced by an external connection element 11 provided on each of the contacting units 7. The external connection element 11 is configured as a strip-like extension of the central piece 8. In the embodiment shown, the external connection elements 11 are each angled to have a portion closed by the cover 10 and a portion that protrudes from a side of the housing 1 such that the connection elements 11 are accessible from an outside of the housing 1. Alternatively, the external connection elements 11 may be configured in such a way that a contact may be produced by a screwed connection.

In the electronic module described herein, it is easy to make contact with the contact faces 5 of the semiconductors 4. Because of the elastic inward flexing of the contact tongues 6 and the support elements 9, the contact tongues 6 are pressed with a defined pressing force against the contact faces 5 of the semiconductors 4 such that reliable contact is maintained under changing mechanical and thermal conditions. Alternatively, electrically conductive connections between the semiconductors 4 and the various contact faces 5 of the semiconductors 4 may be produced by the central piece 8. Because the contact tongues 6 also rest on the substrate 3 (copper layer 3b), electrically conductive connections to the substrate 3 and to the lower sides of the semiconductors 4 may still be produced. The contacting units 7, in addition to the copper layers 3b, 3c of the substrate 3, therefore, also function as printed conductors.

The contact element 6 and/or the support element 9 preferably each project obliquely from the main plane of the contacting unit 7 and are angled in their end region. This has the advantage that the elastic yielding capacity of the contacting unit 7 is produced by a very simple geometry and in that protective contacting over a large area is possible owing to the angled end regions, which allows for a high current throughput.

This type of contacting of the semiconductor 4 has the advantage that the costs for producing an electrically conductive connection to the semiconductor 4 are extremely low, as no expensive automatic soldering machines or similarly complex special machines are required. In addition, the electrically conductive connection produced in this way is distinguished by an extremely long service life and in particular by load change resistance and temperature change resistance. This is because there is no integral connection between the contacting unit 7 and the contact face 5 of the semiconductor 4 which would be heavily stressed especially in constantly changing conditions. Instead, mechanical effects and changes of shape caused by thermal expansion can be compensated by the possibility of a relative movement between the contacting unit 7 and the contact face 5 of the semiconductor 4 and/or by elastic deformation of the contacting unit 7. A further advantage is that damage to the semiconductor 4 by the contacting process can be virtually ruled out as mechanical effects on the semiconductor 4 occurring during the contacting process are cushioned by the yielding capacity of the contacting unit 7. Finally, it is also advantageous that an insert of environmentally detrimental materials can be dispensed with during contacting.

The contacting unit 7 may rest on at least one contact face 5 of the same semiconductor 4. The contacting unit 7 may also rest on at least one contact face 5 of at least one further semiconductor 4 of the electronic module. Finally, the contacting unit 7 may also rest on the substrate 3. Therefore, the most varied contacting wishes can be met without design changes, so the particular circumstances, in each case, of the respective application can be allowed for. Moreover the number of contacting units 7 required per electronic module may be kept low so assembly costs are not very high.

Moreover, at least one contacting unit 7 generally has one connection element 11 for producing an external connection to the electronic module. Because external connections do not need to be specially produced, cost is reduced. The reliability of the external connections is also increased, since the connection elements 11 are each formed in one piece with the associated contacting unit 7.

The electronic module may comprise at least one positioning aid for the correctly positioned arrangement of at least one contacting unit 7. In particular, the positioning aid may be configured as at least one recess in the housing 1. This has the advantage that the contacting unit 7 can be arranged simply and precisely, in each case, in the electronic module. The positioning aid may also serve, in an advantageous manner, to permanently fix the contacting unit 7 in the electronic module and therefore prevent accidental displacement of the contacting unit 7.

The contacting unit 7 may be formed as a one-piece sheet metal part. A sheet-metal part is, on the one hand, economical to produce and, on the other hand, can be machined very easily and diversely, stamping processes in particular being available for machining as these can be carried out quickly and economically. The contacting unit 7 is preferably formed as a stamping for this reason. Further advantages of a sheet-metal part are the robustness and long service life thereof and the plurality of available materials which allow optimization of the material properties for the respective application. In addition, the entire cross-section of the contacting unit 7 is available for electrical conductivity when using a sheet-metal part.

The foregoing illustrates some of the possibilities for practicing the invention. Many other embodiments are possible within the scope and spirit of the invention. For example, to further facilitate the manufacture of the electronic module, the contacting units 7 may be configured as a lead frame. Additionally, the support elements 9 may be dispensed with or replaced by rigid elements, and the base plate 2 of the housing 1 may be eliminated. It is, therefore, intended that the foregoing description be regarded as illustrative rather than limiting, and that the scope of the invention be given by the appended claims together with their full range of equivalents.

We claim:

1. An electronic module, comprising:

a housing with a cover;

a semiconductor arranged on a substrate, the semiconductor having an electrically conductive contact face on a side remote from the substrate;

a contacting unit configured to be at least partially elastically yielding, the contacting unit including a support element and contact tongues that extend from opposite sides of a central piece, the support element extending toward the cover and being configured to press the contacting unit toward the substrate, the contact tongues extending toward the substrate, the contact tongues and the support element being elastically yielding toward the central piece; and the support element being supported by the cover such that when the cover is received on the housing the support element presses the contact tongues against the contact face to make electrical contact.

2. The electronic module of claim 1, wherein the substrate further comprises a copper layer and the support element presses the contact tongues against the copper layer to make electrical contact.

3. The electronic module of claim 1, wherein the contact tongues extend obliquely from the central piece.

4. The electronic module of claim 1, wherein the contact tongues and the support element have the same shape.

5. The electronic module of claim 1, wherein the contact tongues have ends positioned parallel to the central piece.

6. The electronic module of claim 1, wherein the contacting unit is configured as a one-piece sheet metal part.

7. The electronic module of claim 1, wherein the contacting unit includes a connection element to produce an external connection to the electronic module.

8. The electronic module of claim 1, further comprising a positioning aid for correctly positioning the contacting unit.

9. The electronic module of claim 1, wherein the contacting unit is configured as a lead frame.

10. The electronic module of claim 1, wherein the contacting unit contacts the contact face.

11. The electronic module of claim 8, wherein the positioning aid is a recess in the housing of the electronic module.

* * * * *